United States Patent [19]

Benn et al.

[11] Patent Number: 5,762,224
[45] Date of Patent: Jun. 9, 1998

[54] ENVIRONMENTAL ENCLOSURE AND METHOD OF SEALING SAME

[75] Inventors: Alexander Benn, Stuttgart; Peter Henderson, Todenfeld; Detlev A. Lohmuller, Bonn, all of Germany; Paulmer M. Soderberg, Palo Alto, Calif.; Marc F. Moisson, Los Altos, Calif.; Lowell I. Koht, Foster City, Calif.

[73] Assignee: Ericsson Raynet, Menlo Park, Calif.

[21] Appl. No.: 805,895

[22] Filed: Feb. 24, 1997

Related U.S. Application Data

[63] Continuation of Ser. No. 401,529, Mar. 10, 1995, abandoned.

[51] Int. Cl.[6] .............................. B65D 6/00; B65D 45/28; B65D 55/14
[52] U.S. Cl. .......................... 220/402; 70/159; 220/4.22; 220/210; 220/325; 220/347
[58] Field of Search .................... 220/4.02, 4.21, 220/4.22, 331–333, 325, 326, 329, 210, 344, 345, 346, 347; 70/158–161, 163, 166–168, 232

[56] References Cited

U.S. PATENT DOCUMENTS

| | | | |
|---|---|---|---|
| 2,357,214 | 8/1944 | McDole | 220/212 |
| 2,782,455 | 2/1957 | Motsinger | 220/331 X |
| 2,867,348 | 1/1959 | Morrison | 220/331 |
| 3,179,759 | 4/1965 | Rice et al. | 70/159 |
| 3,349,947 | 10/1967 | Zumwalt | 70/158 |
| 3,399,553 | 9/1968 | Lehto | 70/158 |
| 3,734,335 | 5/1973 | Lincoln | 220/210 X |
| 3,746,207 | 7/1973 | Lenhart | 220/326 |
| 4,031,312 | 6/1977 | Coleman et al. | 220/344 X |
| 4,126,224 | 11/1978 | Laauwe et al. | 220/347 X |
| 4,194,100 | 3/1980 | Cox et al. | 220/326 X |
| 4,238,049 | 12/1980 | Lehmann et al. | 220/331 |
| 4,496,050 | 1/1985 | Kirchner et al. | 220/331 X |
| 4,909,579 | 3/1990 | Liu | 220/331 X |
| 5,533,642 | 7/1996 | Lafond et al. | 220/333 X |

FOREIGN PATENT DOCUMENTS

| | | | |
|---|---|---|---|
| 2631 | of 1912 | United Kingdom | 220/326 |
| 443153 | 2/1936 | United Kingdom | 220/210 |

*Primary Examiner*—Allan N. Shoap
*Assistant Examiner*—Niki M. Kopsidas
*Attorney, Agent, or Firm*—Lyon & Lyon LLP

[57] ABSTRACT

A re-enterable environmentally sealed enclosure for housing circuitry and/or cable components of a communication network employs a removable cover attached to an enclosure base by a pivoting cam-tracking system. The tracking configuration positions the cover in a manner that, as it approaches the enclosure base when being closed, a seal located in the cover is evenly compressed along its entire perimeter against a corresponding mating surface on the base, thereby distributing the compressive force equally across the entire seal, with any shear forces substantially eliminated. A single tensioning system is provided adjacent the cam-tracking system, so that the tracking system does not operate as a counter-lever to the tensioning system, and visa versa, thereby improving the distribution of force across the seal.

6 Claims, 4 Drawing Sheets

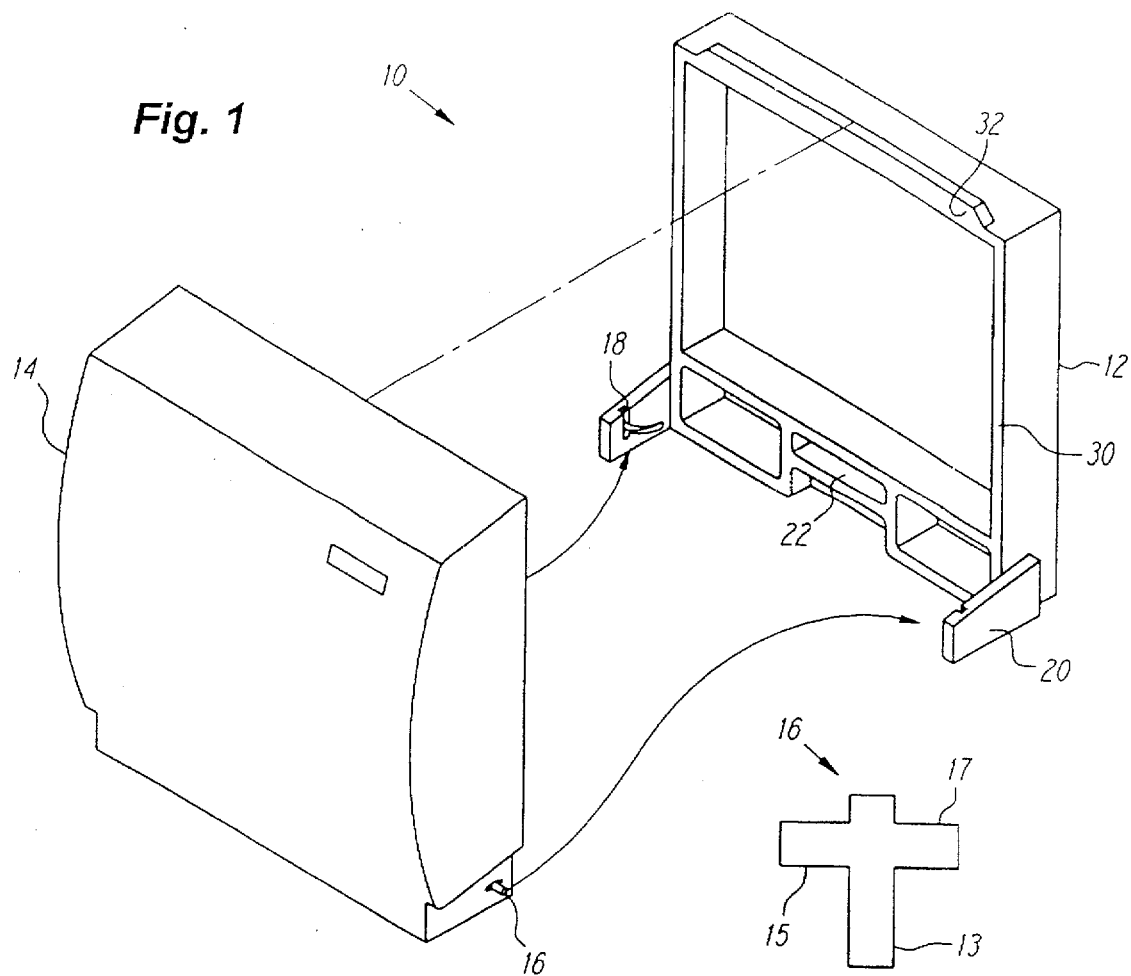
Fig. 1
Fig. 1A
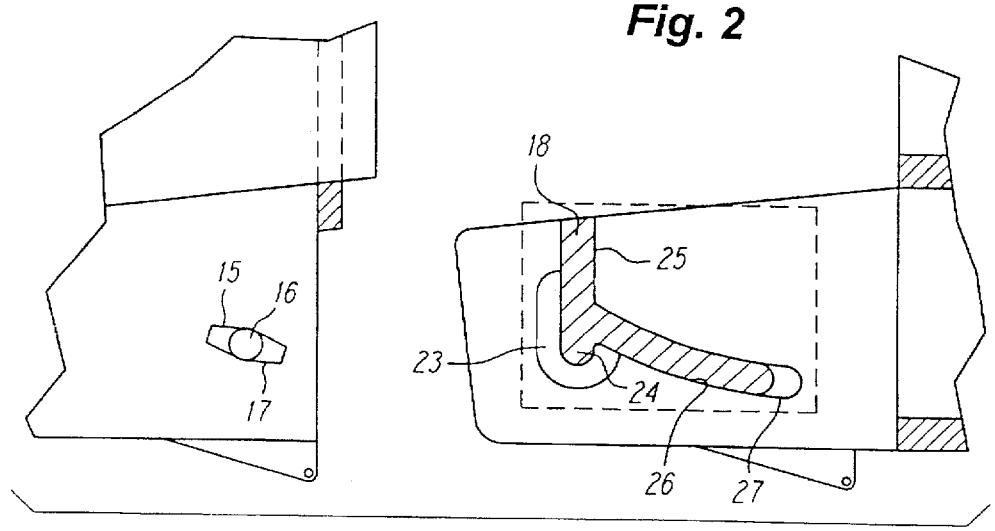
Fig. 2

005,762,224

ENVIRONMENTAL ENCLOSURE AND METHOD OF SEALING SAME

This is a continuation of application Ser. No. 08/401,529, filed Mar. 10, 1995, now abandoned.

BACKGROUND OF THE INVENTION

1. Field of the Invention

This invention pertains to the field of environmental enclosures for housing circuitry and/or cable components of a communication network.

2. Prior Art Systems and Methods

In conventional communication networks, such as, for example, telecommunication or cable television distribution networks, it is often desirable to protect various electrical circuitry components and/or cable connection, or splice locations from contamination caused by environmental elements such as dust or moisture particles. This is typically accomplished by the use of an environmentally sealed housing, or "enclosure", in which the electrical circuitry and/or cable portions that require protection are stored. Generally, it is desirable that technicians be able to easily access the interior of the enclosures to install, inspect, repair or replace components stored therein and/or perform cable installation or repair activities.

Enclosure access is typically provided through a removable cover or "door", which forms part of the enclosure when closed. Both detachable and permanently attached enclosure door designs are known, such as, for example, a removable door attached by one or more screws. A known configuration of a permanently attached door is a door fixed by one or more hinges to the enclosure body at one side, with a "tensioning" latch mechanism located on the other side for securing the door to the enclosure. Both detachable and permanently attached door designs are desirable under certain circumstances; e.g., a removable door will allow a service technician greater working room, especially if the enclosure is located in a corner of a room or other hard to reach spot, whereas a permanently attached hinged door relieves the technician from having to care for the door during the time the enclosure is open, which is especially important, for example, if the enclosure is located atop a telephone pole, the whether conditions are poor, the ground is muddy, etc.

Typically, a seal is provided along the perimeter of either the inside surface of the door or along the corresponding mating edge of the enclosure body so that, once the door is secured, the interior of the enclosure is substantially air and water tight. Typical seals are made of a suitable material, which is selected to have the necessary physical characteristics to compensate for a wide range of fluctuating temperature and atmospheric pressure differences. A "tight" seal is accomplished by a tensioning means, e.g., by manually tightening one or more screws, or by a locking leveraged mechanism, which "pushes" the door against the corresponding mating edge of the enclosure body until the seal is sufficiently deformed about its entire perimeter, thereby closing off access to air and water particles. In known hinged door configurations, the locking mechanism is generally found on the opposing side of the hinges and also serves to prevent unauthorized access into the enclosure.

Problems with seal failures, however, have been attributed to both types of doors. Fixed hinges along one side of an enclosure cause a differential of applied compressive sealing pressure across the seals as well as sideways shearing forces, thereby causing the sealing material to distort and wear over time. Likewise, multiple screw points, or other type of fasteners, when not tightened in a synchronized manner, result in the compressive force being unevenly distributed across the seal and in a differing degree, each time the screws are tightened. Even a single screw, or other type of single fastener is problematic, since the pressure may not be distributed equally across the seal in the known enclosure art.

SUMMARY OF THE INVENTION

The present invention comprises an improved enclosure design, including a removable cover attached to an enclosure base by a pivoting cam-tracking system. The novel pivoting cam-tracking system allows the cover to be positioned in a manner that when sealing the enclosure, as the cover approaches the enclosure base, a seal, preferably residing in the cover is evenly compressed around the entire perimeter of the cover against a corresponding surface of the base, thereby distributing the compressive force equally along the entire seal, substantially eliminating shear forces. In preferred embodiments, the pivoting cam-tracking system includes grooves configured in a concentric, or semi-circular track, to facilitate the even mating of the seal upon the enclosure base. Preferably a single tensioning means is provided adjacent the pivoting cam-tracking system, so that the pivoting cam-tracking system does not operate as a counter-lever to the tensioning means, and visa versa, thereby facilitating the distribution of force along the seal. The wear on the seal is minimized, resulting in greater reliability and longer seal life.

The preferred pivoting cam-tracking system also allows the door to remain attached to the enclosure while it is open, or to be completely removed, whichever better suits the needs of the technician under the circumstances.

Thus, it is an object of the invention to provide an improved design for environmental enclosures housing circuitry and/or cable components of a communication network.

As will be apparent to those skilled in the art, other and further objects and advantages will appear hereinafter.

BRIEF DESCRIPTION OF THE DRAWINGS

It is to be understood that the accompanying drawings are provided for the purpose of illustration only, and are not intended as a definition of the limits of the invention. The drawings illustrate both the design and utility of preferred embodiments of the present invention, in which:

FIG. 1 is a perspective view of an environmental enclosure according to the invention, with its base and cover sections separated for illustrative purposes;

FIG. 1A is a plan view of a preferred cam;

FIG. 2 is partial elevated side views of a tracking cam located on the cover and its corresponding mating channel located in the base;

DETAILED DESCRIPTION OF THE PREFERRED EMBODIMENTS

Figure 3:
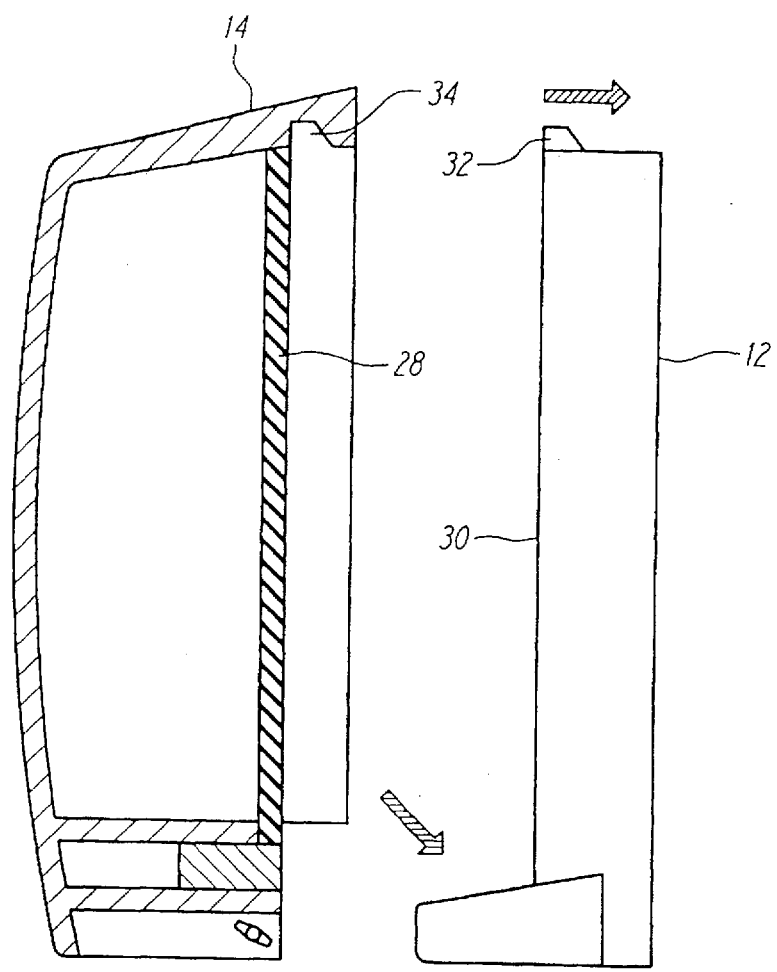
FIG. 3 is a partial cross-sectional view of the cover, and a side elevation of the base plate.

As seen in FIGS. 1 and 2, a sealed enclosure 10 includes a base portion 12 and a cover portion 14. The pivoting camtracking system preferably includes a pair of cams 16 extending from respective opposing corners of the cover. As seen in FIG. 1A the cams 16 comprise shaft 13 and a pair of tabs 15 and 17. The cams 16 are preferably configured to fit snugly, but slidably, in a pair of tracking channels 18 located in respective flange extensions 20 of opposing sides of base 12. As is best seen in FIG. 2, the preferred tracking channels 18 include an extended closure portion 26, a central pivot portion 24, a tab rotation chamber 23 and an entry slot 25. To seal the cover 14 to the base portion 12, the cams 16 are first slid into the entry slot 25 by aligning the tabs with the entry slot 25, then into the central pivot portion 24 and finally, by rotating the door, the tabs are aligned with the extended closure portion 26 and slid along the extended closure portion of the respective tracking channels 18.

The enclosure 10, as necessary to the application, will include openings for the entry and exit of cables. Examples of the preferred cable retention and sealing devices for the entry and exit of cables can be found in commonly owned, co-pending patent application entitled, "Cable Retention And Sealing Device," application Ser. No. 08/401,527 and which is fully incorporated by reference herein.

Figure 4A:
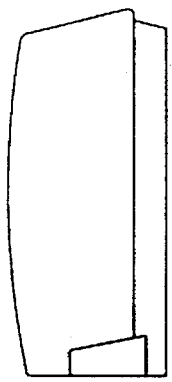
FIGS. 4A–E illustrate various positions of the cover relative to the base.
Figure 4B:
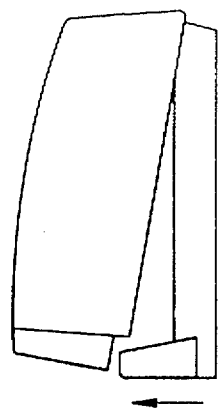
Figure 4C:
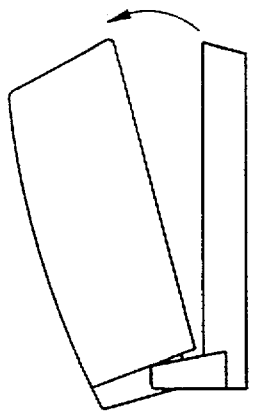
Figure 4D:
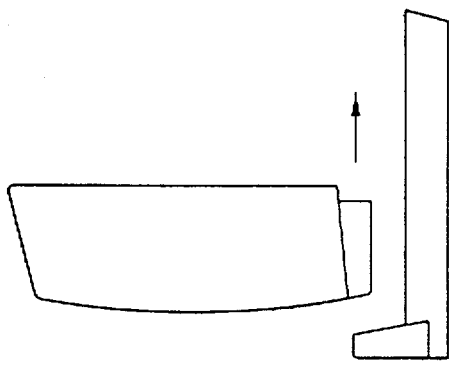
Figure 4E:
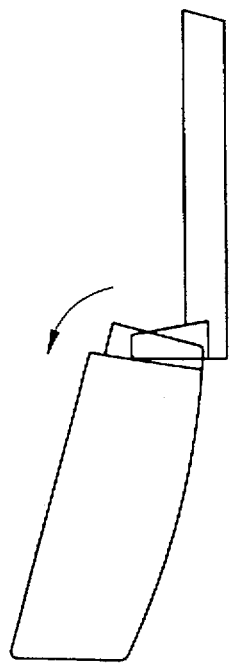

To open the enclosure and remove the cover 14, (FIGS. 4A–E), the bottom part of the cover 14 is pulled away from the base 12, with the extended closure portion 26 guiding the travel of the cams 16. (FIG. 4B) Once the cams 16 reach pivot portions 24 in the respective tracking channels, the cover 14 may be rotated in a counterclockwise direction from the base 12. (FIG. 4C). Once in this position, the cover may be easily removed by lifting the respective cams 16 through the remaining length of the respective tracking channels 18 (FIG. 4D). In the alternative, the technician may allow the cover to pivot completely "downward" along the pivot portion 24, and "hang" below the base 12 (FIG. 4E). When hanging, the shaft 13 rests in the pivot portion 24 and the tabs 15 and 17 are in the tab rotation chamber 23. The tabs 15 and 17 are captured by the tab rotation chamber 23. To secure the cover 14 to the base 12, the cams 16 must first be placed back into the respective tracking channels 18, and the cover 14 rotates clockwise, until the cams 16 reach the pivot points 24 of the tracking channels, and the top portion of cover 14 reaches over the top portion of base 12. (See FIG. 3) A mating groove 34 located in the upper, inner recess of the cover 14 is configured to rest snugly upon a pivot lip 32 located along the top portion of the base 12. The lower part of the cover 14 is then "pivoted" forward into the base 12, with the cams 16 moving along, and guided by, the closure portion 26 of the respective tracking channels 18, until the cams 16 abut against the respective ends 27.

In accordance with the invention, as the cover 14 approaches the base 12, the path of the cams 16 in the respective tracking channels 18 causes a seal 28 preferably of a rectangular cross-section and affixed to the cover in a conventional fashion located within the inner perimeter of a recess of the cover 14 to mate with a corresponding preferably flat surface 30, which runs around the perimeter of the enclosure base 12, in a manner that the seal 28 is evenly and simultaneously compressed across its entire perimeter against a corresponding mating surface 30 on the base, thereby distributing the compressive force equally across the entire seal. In preferred embodiments, the tracking channels 18 are configured in a carefully plotted concentric, or semi-circular track, with the center of the radius of curvature preferably being located at the pivot lip 32, so that the seal 28 compresses squarely against surface 30, thereby minimizing any harmful shear forces on the seal 28.

Figure 5:
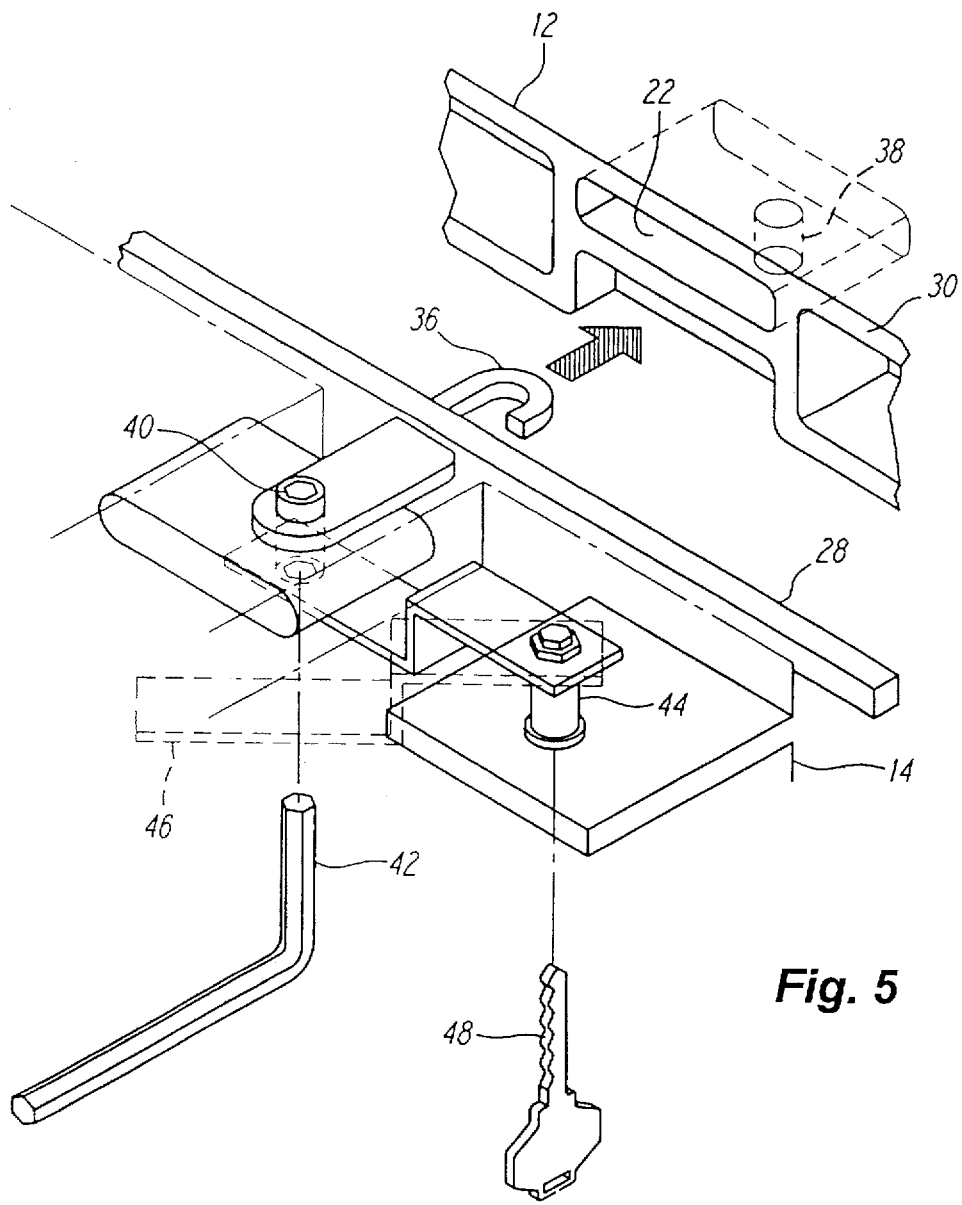
FIG. 5 is a partial cut-away perspective view of the cover and base, wherein the locking and tensioning apparatus are reveled.

Referring to FIG. 5, the cover 14 is secured to the base 12 by means of a tensioning system comprising a hook 36 located within the bottom portion of the cover 14, which attaches about a fixed column member 38 located in a recess 22 of the plate 12. As the cover 14 is pressed against the base 12, the excentric, rotating hook 36, which extends beyond the seal 28, enters the recess 22 adjacent column 38. To fasten the hook 36 about the column 38, preferably an allen wrench 42, or the like, is inserted into an adjusting mechanism, preferably a nut 40. The adjusting nut 40 causes hook 36 to be pulled into, or away from, column 38, depending upon the direction the wrench 42 is turned. As such, the enclosure seal may be tightened by turning the allen wrench 42 sufficiently.

In preferred embodiments the tensioning system (hook 36, column 38, and adjusting nut 40) is located outside of the sealed portion of the enclosure 10. A security system preferably comprising a key-operated blocking member 46, which prevents the insertion of the wrench 42 into the adjusting nut 40, is provided separately from the above-described tensioning system. In the illustrated preferred embodiment, the blocking member 46 is positioned over the adjusting nut 40, by means of a keyed locking mechanism 44. To open the enclosure 10, an appropriate key 48 must be inserted into the locking mechanism 44 and turned to cause blocking member 46 to be rotated away from the adjusting nut 40. Because the tensioning system is provided adjacent the cam-tracking system, (i.e., along the same side of the enclosure), the tracking system does not operate as a "counter-lever" to the tensioning system, (and visa versa), thereby improving the even distribution of the compressive force across seal 28. The resulting wear on the seal is minimized resulting in greater reliability and longer seal life. Further, the locking mechanism is hidden from view providing for "clean" frontal look on the cover, i.e., the lock is not readily apparent to a passerby, thereby reducing possible theft attempts or vandalism.

The pivoting cam-tracking system allows the cover 14 to remain attached to the enclosure while it is open, or to be completely removed, whichever better suits the needs of the technician under the circumstances.

When the cover is being secured, the pivot lip 32 and mating groove 34 are tightly engaged and in combination with the cams 16 and tracking channels 18, apply consistent sealing tension to the top and sides of the seal 28 and surfaces 30. Preferably, a carefully plotted concentric or semi-circular track 26 is used to gently raise groove 34 sufficiently that the cover 14 is free to swing outward when opening. Tabs 15 and 17 in the cams can be used to prevent this motion until they have reached the pivot points 24.

Thus, an improved environmental enclosure and method of sealing same, has been disclosed. While embodiments and applications of the present invention have been illustrated and described, it would be apparent to those skilled in the art that many other modifications are possible without departing from the inventive concepts herein.

The scope of the invention, therefore, is not to be restricted except in the spirit of the appended claims.

We claim:

1. An enclosure, comprising:
    a base, said base-comprising a first base end an second base end; and
    a cover, said cover comprising a first rover end and a second cover end, said first base end and said first cover end coupleable to form a first hinge assembly having a first pivot axis, said second base end and said second cover end coupleable to form a second hinge assembly having a second pivot axis, said cover pivotable with respect to said base about said first pivot axis in a first direction when said second base end and said second cover end are uncoupled, said cover pivotable with respect to said base about said second pivot axis in a second direction when said first base end and said first cover end are uncoupled, wherein said first hinge assembly comprises a tracking channel, said tracking channel comprising an entry slot, an extended closure portion, and tab rotation chamber, respectively, said entry slot comprising a first entry slot end and a second entry slot end, said first entry slot end comprising an opening, said second entry slot end comprising a central pivot portion, said extended closure portion integral with and connected to said entry slot, said tab rotation chamber integral, with substantially surrounding said central pivot portion, and wherein said first hinge assembly further comprises a cam, said cam having a cylindrical shaft and a pair of opposing tabs.

2. The enclosure of claim 1, wherein a portion of said central pivot portion is substantially circular, a first portion of said tab rotation chamber is substantially circular, and a second portion of said tab rotation chamber is substantially non-circular, and wherein said extended closure portion has a generally circular shape with a radius of curvature having a center located approximately at said second pivot axis.

3. The enclosure of claim 2, wherein said cylindrical shaft is configured to slidingly fit in said channel, said substantially circular portion of said central pivot portion has a radius of curvature equal to the radius of said cylindrical shaft, and wherein said first portion of said tab rotation chamber has a radius of curvature substantially equal to the distance between the tip of said tab and the axis of said cylindrical shaft.

4. An enclosure, comprising:

a base, said base comprising a first base end and second base end;

a cover, said cover comprising a first cover end and a second cover end, said first base end and said first cover end coupleable to form a first hinge assembly having a first pivot axis, said second base end and said second cover end coupleable to form a second hinge assembly having a second pivot axis, said cover pivotable with respect to said base about said first pivot axis in a first direction when said second base end and said second cover end are uncoupled, said cover pivotable with respect to said base about said second pivot axis in a second direction when said first base end and said first cover end are uncoupled; and a tensioning system, said tensioning system comprising a rotatable hook member and a column member, said column member configured to receive said rotatable hook member.

5. The enclosure of claim 4, wherein said rotatable hook member is eccentric, and wherein said column member is configured such that said cover is compressed against said base as said column member receives said rotatable hook member.

6. The enclosure of claim 5 further comprising an adjusting nut configured to rotate said hook member.

\* \* \* \* \*